United States Patent [19]

Okai et al.

[11] 4,283,481
[45] Aug. 11, 1981

[54] ELEMENT HAVING PHOSPHINE ACTIVATED PHOTOSENSITIVE COMPOSITIONS THEREIN

[75] Inventors: Sakuo Okai, Carlsbad; Koichi Kimoto, Oceanside, both of Calif.

[73] Assignee: Napp Systems (USA) Inc., San Marcos, Calif.

[21] Appl. No.: 161,757

[22] Filed: Jun. 23, 1980

Related U.S. Application Data

[60] Division of Ser. No. 70,190, Aug. 27, 1979, Pat. No. 4,233,391, which is a continuation-in-part of Ser. No. 941,519, Sep. 9, 1978, abandoned.

[51] Int. Cl.³ ............................................. G03C 1/78
[52] U.S. Cl. ................................. 430/271; 430/275; 430/278; 430/523; 430/524; 430/950; 430/281
[58] Field of Search ............... 430/271, 275, 278, 523, 430/524, 950, 905, 909, 917, 288, 281, 282, 283; 204/159.23

[56] References Cited

U.S. PATENT DOCUMENTS

| | | | |
|---|---|---|---|
| 3,668,093 | 6/1972 | Rettig | 204/159.23 |
| 3,767,547 | 10/1973 | Puhk | 204/159.23 |
| 3,801,328 | 4/1974 | Takimoto et al. | 96/115 P |
| 3,933,682 | 1/1976 | Bean | 204/159.23 |
| 3,966,573 | 6/1976 | Bean | 204/159.23 |
| 4,042,386 | 8/1977 | Okai et al. | 96/115 P |
| 4,069,056 | 1/1978 | Crivello | 204/159.23 |
| 4,077,860 | 3/1978 | Via | 204/159.23 |

*Primary Examiner*—Jack P. Brammer
*Attorney, Agent, or Firm*—Hosier, Niro & Daleiden, Ltd.

[57] ABSTRACT

A photopolymerizable composition and photosensitive elements produced therefrom are disclosed. The photopolymerizable composition includes: (a) a monomer component, (b) a polymer component, (c) a photopolymerization initiator, and (d) an activator.

The monomer component contains at least one water soluble, monofunctional unsaturated ethylenic monomer or the combination of such a monomer and at least one polyfunctional unsaturated ethylenic monomer.

The polymer component includes a partially saponified water soluble, polyvinyl acetate polymer compatible with the monomer components. The polyvinyl acetate polymer contains both acetyl and hydroxyl groups and has a polymerization degree of from 300-2000. The degree of saponification of the polymer is desirably in the range of 65 to 99 percent.

The preferred photopolymerizaton initiators are acetophenone derivatives such as 2,2-dimethoxy-2-phenyl acetopheonone, 2,2-diethoxy-2-phenyl acetophenone, 2,-2-diisopropoxy-2-phenyl acetophenone, benzoin alkyl, aryl, allyl or vinyl ethers, or benzophenone derivatives such as benzophenone, 2-methylbenzophenone, 2-methoxybenzophenone or 2,2'-dimethoxybenzophenone, which are compatible with the monomer component and the polyvinyl acetate polymer and are activatable by actinic light.

Finally, the activator is a phosphine derivative generally described by the formula:

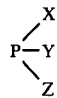

wherein any of X, Y and Z are hydrogen, halogen, alkyl, alkoxy, aryl, vinyl, or allyl, although not more than one of X, Y and Z may be hydrogen. It is especially preferred in the practice of the present invention that at least one of X, Y or Z in the phosphine derivative activator component be an aryl group.

6 Claims, No Drawings

ELEMENT HAVING PHOSPHINE ACTIVATED PHOTOSENSITIVE COMPOSITIONS THEREIN

RELATED APPLICATION

This is a division of application Ser. No. 70,190, filed Aug. 27, 1979, now U.S. Pat. No. 4,233,391 which is a continuation-in-part of application Ser. No. 941,519, filed Sept. 9, 1978, now abandoned.

BACKGROUND OF THE INVENTION

The present invention relates to a new class of water-developable photopolymerizable compositions, and photosensitive elements and photopolymer printing plates that utilize such compositions. More specifically, the novel photopolymerizable compositions of the present invention can be used without any pre-exposure conditioning of the type that has become customary with various prior art compositions. The present compositions thus provide photosensitive elements and photopolymer printing plates that not only have vastly improved printing characteristics, but can be directly subjected to an imagewise exposure and then developed with water without any costly or time consuming pre-exposure conditioning steps.

Many photopolymerizable compositions and photosensitive elements that are useful in making printing plates of one kind or another are known in the art. One, if not the most, commercially successful of all such prior art compositions is described in U.S. Pat. No. 3,801,328 to Takimoto et al. Such compositions, although they have met with enormous commercial success, nevertheless require some form of pre-exposure conditioning before imagewise exposure in order to produce commercially satisfactory relief images on printing plates that employ such compositions.

Two techniques for pre-exposure conditioning have evolved in the art. The first, commonly known as $CO_2$ conditioning, requires the maintenance of the photosensitive element or plate in a $CO_2$ atmosphere until just prior to the imagewise exposure of the element or plate. The second known technique, which has supplanted the $CO_2$ conditioning technique and is commonly known as "bump exposure", requires that the photosensitive element or plate be subjected to a brief (typically 2 to 8 second) light exposure immediately prior to the longer duration imagewise exposure, in the presence of a negative.

It has been recognized, of course, that both pre-exposure conditioning techniques require special, costly and time consuming additional handling of the photosensitive element or plate that, from a plate processing standpoint should desirably be eliminated. Moreover, both techniques make the design and operation of automatic plate exposure and processing equipment unduly complicated and expensive. And perhaps even more importantly, both techniques, because of the necessity that imagewise exposure be carried out within a designated time period after pre-exposure conditioning occurs, introduce time controls in plate processing that are oftentimes difficult, if not impossible, to carefully maintain in the large quantity, commercial newspaper applications for such plates.

It has been determined by the applicants herein, for example, that a printing plate that has been "bump" exposed should desirably be subjected to an imagewise exposure within approximately 30 seconds after the bump exposure is completed. Variations in this period of plate dormancy, between the completion of the bump exposure step and the initiation of the imagewise exposure steps can, and often does, produce developed plates having vastly different printing quality characteristics. Thus, two plates utilizing the same photopolymer composition and same negative can have different printing characteristics simply because the period of dormancy between bump and imagewise exposure varies.

Moreover, photosensitive elements and plates, which are subjected to bump exposure, must typically be exposed under high intensity point sources of actinic light, such as carbon arc lamps or high pressure mercury vapor lamps. Such lamps not only have extremely high current demands and short lives, but in normal operation produce unwanted heat, which can cause or contribute to the degradation of the photopolymerizable compositions or cause negatives to stick to the plate photopolymer surface.

As a result of the many inconveniences, the added expenses and variations in product quality inherent in the use of plates requiring some form of pre-conditioning, either through $CO_2$ conditioning or bump exposure, a need has developed for water-developable photopolymerizable compositions (and resultant elements and plates) that entirely eliminate the necessity of pre-exposure conditioning, yet at the same time provide all of the advantageous properties of the commercially desirable compositions of the type described in the Takimoto U.S. Pat. No. 3,801,328 patent. One such effort to solve the pre-exposure conditioning problem is described in U.S. Pat. No. 4,042,386 to Okai and Kimoto, wherein the selection and use of specific components, in certain ratios and amounts, and intensified exposure of the resulting photosensitive element or plate, are disclosed as means of eliminating the need for pre-exposure conditioning. This approach, however, suffers from the disadvantage that only carefully selected components and ratios amounts of such components can be used, and from the additional disadvantage that only costly high intensity light sources (which have shortened lamp lives and generate excessive amounts of undesired heat) can be used. Moreover, it has been determined that the photopolymerizable compositions disclosed in the Okai and Kimoto patent work best with lower reflectivity substrates (e.g., a high degree of antihalation) in order to provide developed photopolymerizable elements having the desired dot depth characteristics in highlight, middle tone and shadow image areas.

SUMMARY OF THE INVENTION

The photopolymerizable compositions of the present invention not only eliminate the need for any pre-exposure or $CO_2$ conditioning of the resultant photosensitive elements and plates that employ such compositions, but provide water-developable elements and plates that can utilize a wide range of monomer and polymer components, require shortened exposure times and less antihalation conditioning of the plate substrate, can be exposed with less intense light sources, and yet still provide consistently improved printing characteristics; e.g., improved dot depth in highlight, middle tone and shadow image areas, and improved minimum line width and shapes in reverse areas. Furthermore, the photopolymerizable compositions of the present invention can be applied to ultra-shallow relief plates, such as 4 mils to 8 mils in relief thickness, because such compositions are not adversely affected by oxygen exposure.

The surprising and unexpected properties of the photopolymerizable compositions (and resulting photopolymer elements and plates) of the present invention are the result of the selection and use of a unique combination of components, including a defined class of phosphine derivative activator components, which interact with the remaining photopolymerizable composition components to provide the heretofore unrecognizable and unachievable advantages of the present invention.

It is, therefore, an object of the present invention to provide a new photopolymerizable composition and a new photosensitive element which do not require pre-exposure conditioning.

It is another object of the present invention to provide a photopolymerizable composition and a photosensitive element which require shorter exposure times than is required with prior compositions.

It is yet another object of the present invention to provide a photopolymerizable composition and a photosensitive element which can be exposed by a non-diffusion actinic light source.

It is still a further object of the present invention to provide a photopolymerizable composition and a photosensitive element which can be processed more quickly and more efficiently than was hitherto possible.

These and other objects of the present invention together with its various advantages will become apparent to those skilled in the art from a consideration of the following detailed description of various embodiments of the invention.

DETAILED DESCRIPTION OF THE INVENTION

The photopolymerizable composition of the present invention generally includes the following four components:

A. A monomer component including at least one water-soluble, monofunctional unsaturated ethylenic monomer, or the combination of such a monomer and at least one polyfunctional unsaturated ethylenic monomer, said monomers being capable of forming a polymer by photoinitiated polymerization in the presence of a polymerization initiator activatable by actinic light;

B. A polymer component including a partially saponified, water-soluble, polyvinyl acetate polymer compatible with said monomer component, containing both acetyl and hydroxy groups, and having a polymerization degree of about 300 to 2,000, and a saponification degree of about 65 to 99 mole percent;

C. A photopolymerization initiator compatible with said monomer component and said polyvinyl acetate polymer, and activatable by actinic light; and D. An activator component including a phosphine derivative described by the formula:

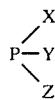

wherein any of X, Y and Z are hydrogen, halogen, alkyl, alkoxy, aryl, vinyl, or allyl, and wherein not more than one of X, Y and Z may be hydrogen.

It has been found especially desirable in the practice of the present invention that at least one of X, Y or Z in the phosphine derivative activator component be an aryl group. Indeed, in those instances in which a phosphine derivative without at least one aryl group have been used (such as tri-n-butylphosphine) the resultant photopolymer plates have unacceptable properties. Thus, the phosphine derivative is preferably selected from among the following compounds: triphenyl phosphine, o-tolyl diphenyl phosphine, di-(o-tolyl) phenyl phosphine, tri-(o-tolyl) phosphine, o-methoxyphenyl diphenyl phosphine, o-ethylphenyl diphenyl phosphine, and o-chlorophenyl diphenyl phosphine. Most preferable among those phosphine derivatives is triphenyl phosphine because of its improved sensitivity, cost and air stability. As noted above, the absence of at least one phenyl group in the phosphine activator component of the present invention does not eliminate the pre-exposure conditioning step. Similarly, the presence of at least one phenyl group (and preferably two or more phenyl groups), especially in an air stable form provide the correct balance of printing plate properties, the elimination of any pre-exposure conditioning and the reduced exposure time and other advantages of the present invention.

The monomer component A found useful in the practice of this invention generally comprises: (1) a monofunctional acrylic or methacrylic ester of a lower alkanol having one or more hydroxy groups, or (2) the combination of such a monofunctional monomer and a polyfunctional acrylic or methacrylic ester of polyethylene glycol [HO(CH$_2$CH$_2$O)$_n$H] which is etherified or esterified at one end thereof and wherein n is desirably between one and twenty-three. Examples of the monofunctional unsaturated ethylenic compound are B-hydroxyethel acrylate, B-hydroxyethyl methacrylate and B-hydroxypropyl acrylate. Examples of the polyfunctional monomer are polyethylene glycoldiesters (e.g., polyethylene glycol diacrylate or polyethylene glycol dimethacrylate). In the said polyethylene glycol derivatives, n is one to twenty-three. In addition, other monomer components such as pentarerythritol dimethacrylate, trimethylolpropane trimethacrylate, tetramethylolmethane tetramethacrylate, and trimethyloleth-ane trimethacrylate may be used solely or in combination.

It should be recognized that the ethylenic unsaturated monomer component includes mixtures of both mono- and polyfunctional compounds, the monofunctional compounds serving as solubilizing materials for the initiator component, and the polyfunctional compounds enhancing the adhesive characteristics of the resultant photopolymerizable composition. Thus, by using both the water-soluble monofunctional ethylene unsaturated compound and polyfunctional ethylenic unsaturated compound, the highly desirable balance of properties, e.g., water-washability and high adhesion, can be imparted to the photopolymerizable composition.

The polymer component B used in the practice of this invention is a partially saponified polyvinyl acetate, preferably having an average degree of polymerization of 300 to 2,000 and a saponification degree of 65 to 99 mole percent. If a suitable partially saponified polyvinyl acetate cannot be obtained by saponifying polyvinyl acetate having a low saponification degree as a homopolymer, a copolymer obtained, for example, by copolymerizing vinyl acetate with maleic anhydride can be partially saponified to give the desired polymer. Saponification as used herein is intended to mean the conversion of ester groups or the like into alcohol groups and the saponification degree represents the extent to which ester groups or the like have been converted to alcohol or hydroxy groups.

The hardness of the obtained printing plate as well as the speed of washing out in the developing procedure depends directly on the degree of saponification. Thus to accomplish the desirable balance of properties in a finished developed plate, it is preferred that the partially saponified polyvinyl acetate have a degree of saponification within the stated range in saponifying polyvinyl acetate. There are some cases, for example, wherein a certain degree of saponification is required for compatibility with certain monomer components. Thus, it has been recognized that the required degree of saponification may be obtained by mixing two or more partially saponified polyvinyl acetate polymers having different degrees of saponification and calculating the arithmetic average of the different degrees of saponification. Mixtures of two or more polymers can be used, therefore, each having a different saponification degree, to obtain the desired average saponification degree for any given monomer component. This feature of the present invention adds significant flexibility to the formulation process and contributes significantly to the balance of properties that are desired for the photopolymerizable composition.

As the initiator component C, acetophenone, benzophenone or benzoin derivatives are used. Benzoin derivatives are soluble in the ethylenic unsaturated monomer component and are highly compatible with the other components in the aqueous composition. Moreover, since benzoin derivatives are not decomposed thermally below about 100° C., they do not harden or become insoluble with heating during the preparation of the photopolymerizable composition. Specific examples of the benzoin derivatives found useful in the practice of this invention are methyl, ethyl, isopropyl, isobutyl, octyl, vinyl, aryl and allyl ethers of benzoin, i.e., benzoin methyl ether, benzoin ethyl ether, benzoin vinyl ether benzoin allyl ether, etc. The benzophenone derivatives found used in the practice of the present invention include benzophenone, 2-methylbenzophenone, 2-methoxybenzophenone, 2,2-dimethoxybenzophe and the like. The presently preferred initiators, however, are acetophenone derivatives, such as 2,2-dimethoxy-2-phenyl acetophenone, 2,2-diethoxy-2-phenyl acetophenone, 2,2-diisopropoxy-2-phenyl acetophenone, and 2,2-di-n-butoxy-2-phenyl acetophenone, because of their unexpectedly high solubility in the monomer component of the photopolymerizable compositions and their excellent photoinitiation properties.

Although ordinarily photopolymerization requires a photoinitiator such as an anthraquinone compound in addition to the polymerization initiators discussed above, a high photosensibility can be attained in the present invention by using acetophenone or benzoin derivative initiators alone.

The amounts of the various components of the photopolymerizable composition of the present invention should preferably lie within the following weight ratios based on the total weight of the composition: (a) about 0.1 to 3.0 parts by weight of the monomer component, (b) about 0.1 to 3.0 parts by weight of the polymer component, (c) about 0.001 to 0.3 parts by weight of the polymerization initiator, and (d) about 0.001 to 0.3 parts by weight of the activator component. It should be recognized, however, that these are suggested ratios which have been experimentally determined to be desirable and preferred. These ratios can nonetheless be altered depending on the particular uses contemplated for the printing elements to be made using the compositions of the present invention. It has been found, however, that when the concentration of the phosphine derivatives used in the present invention exceeds the broad concentration ranges set forth above, the light sensitivity of the photopolymerizable composition is so enhanced as to make it very difficult to handle the photosensitive element prior to imagewise exposure. Also, excessive amounts of the phosphine derivatives cause the photopolymerizable composition to become heat sensitive which further interferes with the practical use of the photosensitive elements and reduces their useful shelf life.

When, on the other hand, the concentration of the phosphine derivative used is less than that specified in the broad concentration range described above, the sensitivity of the photosensitive element will generally be too low to be practically used without the undesired pre-exposure conditioning.

It is also desirable in some instances to add to the photopolymerizable composition of this invention about 0.01 to 0.3 percent, based upon the amount of the monomer component, of a thermal polymerization inhibitor.

Among the thermal polymerization inhibitors found useful in the practice of this invention are 2,6-di-t-butyl-p-cresol, hydro quinone, and p-methoxyphenol. The preferred inhibitor is 2,6-di-t-butyl-p-cresol because of its compatibility with the other components.

The novel photopolymerizable composition of the invention can be cast directly on a metallic and/or plastic supporting adhesive layer. Small amounts of dyestuffs may be added to the photopolymerizable composition to provide antihalation properties. Generally, sufficient amounts are added to the photopolymerizable composition just below that at which the composition becomes hazy. Examples of an effective dyestuff are rose bengal, eosine, methylene blue, and malachite green. These dyestuffs may be used solely or in combination in a ratio of 20 and to 150 ppm based on the amount of the photopolymerizable composition.

The metallic and/or plastic substrate used can be either chemically or physically treated prior to coating with the photopolymerizable material in order to insure strong adhesion with the photopolymerizable composition. This roughening or grating of the substrate surface eliminates the need for a separate adhesive layer although such may be used, where desired, in certain instances.

The preferred substrate is a metallic plate and preferably an aluminum or tin plate. As described in U.S. Pat. No. 3,877,939, the use of a dispersed antihalation material can be eliminated by treating the substrate with an aqueous solution of a chromic compound. Thus, for example, an aluminum plate would first be abraded and then chemically treated to impart the desired antihalation properties. The preferred chemical treatment for obtaining these antihalation properties is a chemical solution of a chromic compound which includes, for example, chromic acid, water soluble salts of chromic acid and ferricyanic or ferrocyanic acid and water soluble salts thereof.

Generally, the useful treating compositions contain either chromic acid or sodium bichromate, as a required component, and mixtures of potassium ferricyanide, barium fluosilicate, sodium ferrocyanide, sodium fluoborate, potassium fluozirconate and related compositions. The presently preferred treating compositions is 2 percent aqueous solution of "Alodine 1200" manufactured by Amchem Products, Inc., Ambler, Pa. The treating composition is typically first placed in a bath and then the aluminum or tin support plate is immersed in the bath for approximately 40 seconds. After the support plate has been treated in this fashion, it generally changes its color from the metallic aluminum or tin color to an orange color. In this way, the orange-colored aluminum or tin support plate itself provides the antihalation function for the resultant photopolymer printing plate.

As discussed above, however, the degree of antihalation required in the photopolymer plates made from the photopolymerizable plates made from the photopolymerizable compositions of the present invention is reduced, since the presence of the phosphine derivative activator component in the composition minimizes the need for lower reflectivity substrates, and thus reduces the manufacturing cost of the photopolymerizable compositions.

Moreover, the exposure of a photosensitive element, including a layer of the water developable photopolymerizable composition described herein upon a substrate involves the step of subjecting the element to a single imagewise exposure of actinic light. Although prior photosensitive elements required the use of high intensity point sources such as carbon arc lamps and/or high pressure mercury lamps, exposure of the photopolymerizable composition of the present invention may be carried out under diffusion light sources such as black light tubes, otherwise known as chemical lamps. These chemical lamps are far less expensive than the prior high intensity point sources, use considerably less energy, and generate less heat. Such chemical lamps give off actinic light with wavelengths in the desired range of 300-400 nanometers, and provide the further advantage of generating better shoulders in the final relief image which results in improved resolution and highlight reproduction.

By eliminating the previously required pre-exposure conditioning that is characteristic of prior art photopolymerizable compositions, the compositions of the present invention shorten plate processing time, and are more readily useable in automatic plate developing equipment. It is no longer found necessary, for example, to engage in the time consuming task of first bump exposing a plate, and then placing a negative on the plate for imagewise exposure. Instead, a negative can be immediately placed on the plate (without bump exposure) and then exposed for a shorter period of time with less intense light, without sacrificing printing plate quality in terms of dot depth or minimum line size.

It should be understood that printing plates having varying degrees of photopolymer thickness can employ the photopolymerizable compositions of the present invention, including relief plates having photopolymer thicknesses greater than 0.020 inch and shallow relief plates having photopolymer layers between 0.004 and 0.020 inch in thicknesses. When such shallow relief plates are desired a binder composition is interposed between the substrate and photopolymer layer. The binder composition contains dispersed within its particles which are present in a size and concentration sufficient to create a plurality of protuberances in the background areas of the photosensitive element after its exposure and development to create a relief image. Useful binders include polyesters, polyurethanes, polyethylene-butadiene copolymers, polyvinyl acetate derivatives, polyamides, epoxy resins, styrene-butadiene copolymers, mixtures of such copolymers and partially hydrolyzed polyvinyl acetate, unsaturated polyesters made, for example, from diethylene glycol, maleic anhydride and phthalic anhydride, mixtures of such polyesters and partially hydrolyzed polyvinyl acetate, and mixtures of glyoxal and partially hydrolyzed polyvinyl acetate. The dispersed particles suitable for use in such plates include glass, "Teflon" polytetrafluroethylene, and alumina beads. Particle size and concentration will of course be chosen on a case by case basis depending on the printing parameters such as the thickness of the relief image, printing pressures, number of repetitions, etc.

Presently preferred and practical embodiments of the present invention are illustrated in the following examples wherein all percentages and parts are by weight unless otherwise indicated.

EXAMPLE 1

Substrates of the photosensitive elements used below are prepared as follows:

Method A: An aluminum plate is immersed in a surface treating agent comprising sodium bichromate (1.0 part), concentrated sulfuric acid (10 parts) and water (30 parts) at 70° to 80° C. for about 20 minutes. Then, the plate is washed with water and dried.

Method B: A tin plate is immersed in a detergent comprising Ridoline (1.0 part; manufactured by Amchem Products, Inc.) and water (30 parts) at 65° C. for about 20 minutes. Then, the plate is washed with water and dried.

Method C: The solution (70 parts) which consists of 14 parts of partially saponified polyvinyl acetate (average polymerization degree, 500; saponification degree, 78.0 mole %) and 86 parts of water, and the well-ground pigment paste (10 parts) which consists of 14 parts of above-mentioned polyvinyl acetate, 56 parts of water and 30 parts of red iron oxide pigment (RO-5097 manufactured by Pfizer) are mixed together. The latex of carboxylated styrene/butadiene copolymer (20 parts) (XD-655 manufactured by Dow Chemical Co.) is added into the resulted solution gradually under stirring. The solution is cast on the plate which is described in Method B and dried for 2 minutes at 190° C. to form the layer 15μ in thickness.

Method D: The solution (60 parts) which consists of 14 parts of partially saponified polyvinyl acetate (average polymerization degree, 500; saponification degree, 78.0 mole %) and 86 parts of water, and the well-ground pigment paste (15 parts) which consists of 14 parts of above-mentioned polyvinyl acetate, 56 parts of water and 30 parts of red iron oxide pigment (RO-5097 manufactured by Pfizer) are mixed together. The latex of carboxylated styrene/butadiene copolymer (20 parts) (XD-655 manufactured by Dow Chemical Co.) is poured into the resulted solution gradually under stirring, and 5 parts of teflon power (TL-115 by LNP Co.) is added into the solution. The solution is cast on the plate which is described in Method B and dried for 2 minutes at 190° C. to form the layer 20 microns in thickness.

EXAMPLE 2

A mixture of partially saponified polyvinyl acetate (average polymerization degree, 500; saponification degree, 82.0 mol %) (35 parts), water (30 parts) and Rose bengal (30 ppm of all components by weight) is kneaded in a kneader at 80° to 90° C. for 30 minutes. Then, this mixture is cooled to 60° C. and a mixture of diethylene glycol dimethacrylate (5 parts) B-hydroxyethyl methacrylate (28 parts), hydroquinone (0.1% of total monomer by weight), benzoin iso-propyl ether (0.5 part) and triphenyl phosphine (1.5 parts) is added and stirred for 30 minutes. The resulted photopolymerizable composition is cast on the plate which is described in Example 1, Method C. A polyester sheet is placed thereon and the resulted piled product is passed between two rolls. After cooling, the polyester sheet is peeled off and the plate is dried in a dryer at 75° C. for 40 minutes to form photosensitive layer 20 mils in thickness.

EXAMPLE 3

A mixture of partially saponified polyvinyl acetate (average polymerization degree, 500; saponification degree 77.0 mol%) (5 parts), partially saponified polyvinyl acetate (average polymerization degree, 500; saponification degree 82.0 mol%) (30 parts), water (30 parts) and Eosin (30 ppm of all components by weight) is kneaded in a kneader at 80° to 90° C. for 30 minutes. Then, this mixture is cooled to 60° C. and a mixture of ethylene glycol dimethacrylate (8 parts), B-hydroxypropyl methacrylate (25 parts), hydro-quinone (0.1% of total monomer by weight), 2,2-dimethoxy-2-phenyl acetophenone (1.0 part) and triphenyl phosphine (1.0 part) is added and stirred for 30 minutes. The resulted photopolymerizable composition is cast on the plate which is described in Example 1, Method C. The photosensitive plate is obtained by the same method as described in Example 2, and the photosensitive layer is 20 mils.

EXAMPLE 4

A mixture of partially saponified polyvinyl acetate (average polymerization degree, 500; saponification degree 82.0 mol%) (35 parts), water (30 parts) and Rose bengal (30 ppm of all components by weight) is kneaded in a kneader at 80° to 90° C. for 30 minutes. Then, this mixture is cooled to 60° C. and a mixture of ethylene glycol dimethacrylate (5 parts), B-hydroxypropyl methacrylate (28 parts), hydroquinone (0.1% of total monomer by weight), benzoin iso-propyl ether (1.0 parts) and o-tolyl diphenyl phosphine (1.0 parts) is added and stirred for 30 minutes. The resulted photopolymerizable composition is cast on the plate which is described in Example 1, Method A. The photosensitive plate is obtained by the same method as described in Example 2, and the photosensitive layer is 20 mils.

EXAMPLE 5

The photosensitive resin which is obtained by the method in Example 3, is cast on the plate which is described in Example 1, Method D, and the photosensitive layer is 5 mils after dried.

EXAMPLE 6

A mixture of partially saponified polyvinyl acetate (average polymerization degree, 500; saponification degree, 82.0 mol%) (35 parts), water (30 parts) and Rose bengal (50 ppm of all components by weight) is kneaded in a kneader at 80° to 90° C. for 30 minutes. Then, this mixture is cooled to 60° C. and a mixture of ethylene glycol dimethacrylate (2 parts), B-hydroxyethyl methacrylate (32 parts), hydroquinone (0.1% of total monomer by weight) and benzoin iso-propyl ether (1.0 part) is added and stirred for 30 minutes. The resulted photopolymerizable composition is cast on the plate which is described in Example 1, Method A. The photosensitive plate is obtained by the same method as described in Example 2, and the photosensitive layer is 20 mils.

EXAMPLE 7

The photosensitive resin which is obtained by the method in Example 6, is cast on the plate which is described in Example 1, Method C, and the photosensitive layer is 20 mils after dried.

EXAMPLE 8

The photopolymer plate made according to Example 3 is placed in a vacuum frame and the photopolymerizable surface is brought into contact with a line negative or a half tone negative. It is exposed to a 3,000 watt high pressure mercury arc for 50 seconds from a distance of 20 inches. After exposure, the negative is stripped from the plate and the unexposed polymer is removed by spray washing with water (temperature, 120° F.) under the pressure of 40 psi for 3 minutes. The printing plate is dried at 230° F. for 3 minutes. The printing plates thus prepared show excellent image quality and long press life when used for direct printing and also are utilizable as original plates for a paper mache.

Table I demonstrates the comparison in quality between the photosensitive plates with (Examples 3 and 4) and without (Examples 6 and 7) phosphine derivatives.

TABLE I

|  | Example 3 | Example 4 | Example 6 | Example 7 |
|---|---|---|---|---|
| Exposure Time (sec) | 50 | 45 | 180 | 195 |
| Dot Depth (μ) |  |  |  |  |
| 10% Hi-light | 270 | 260 | 160 | 175 |
| 45% Middle tone | 125 | 120 | 50 | 60 |
| 90% Shadow | 55 | 50 | Plug Dot | Plug Dot |
| Width of Minimum |  |  |  |  |
| Remaining Line (μ) | 40 | 40 | 140 | 140 |
| Gray Step | 17 | 17 | 13 | 13 |

As shown in Table I above, photopolymer plates made with the photopolymerizable compositions of the present invention have improved dot depth characteristics in highlight, middle tone and shadow areas. Dot depths that are less than 200 microns in highlight areas, 80 microns in middle tone areas and 35 microns in shadow areas, (as in the case in Examples 6 and 7) provide dark, unacceptable half tone areas. Moreover, line widths above 50 to 60 microns are generally regarded as unacceptable in newspaper printing applications.

The significance of component selection in the present invention can be demonstrated through a series of tests in which (1) derivatives employing Group V elements other than phosphorus are substituted for the phosphine derivatives of the present invention, (2) phosphine derivatives with no phenyl groups are substituted for the preferred phosphine derivatives having 1, 2 or 3 phenyl groups, and (3) halogenated compounds such as pentachlorobenzene are used as an additional component in the present invention. Table II set forth on the following page shows the results of such tests:

TABLE II

| Formulation | 1 | 2 | 3 | 4 | 5 | 6 | 7 | 8 | 9 | 10 | 11 | 12 |
|---|---|---|---|---|---|---|---|---|---|---|---|---|
| PVA (Saponification degree 77.0 mol %) | 5 | 5 | 5 | 5 | 5 | 5 | 5 | 5 | 5 | 5 | 5 | 5 |
| PVA (Saponification degree 82.0 mol %) | 30 | 30 | 30 | 30 | 30 | 30 | 30 | 30 | 30 | 30 | 30 | 30 |
| Water | 30 | 30 | 30 | 30 | 30 | 30 | 30 | 30 | 30 | 30 | 30 | 30 |
| Eosin | 30ppm | 30ppm | 30ppm | 30ppm | 30ppm | 30ppm | 30ppm | 30ppm | 30ppm | 30ppm | 30ppm | 30ppm |
| Ethyleneglycol dimethacrylate | 8 | 8 | 8 | 8 | 8 | 8 | 8 | 8 | 8 | 8 | 8 | 8 |
| β-Hydroxypropyl methacrylate | 25 | 25 | 25 | 25 | 25 | 25 | 25 | 25 | 25 | 25 | 25 | 25 |
| Hydroquinone | 0.1% of Monomer | 0.1% of Monomer | 0.1% of Monomer | 0.1% of Monomer | 0.1% of Monomer | 0.1% of Monomer | 0.1% of Monomer | 0.1% of Monomer | 0.1% of Monomer | 0.1% of Monomer | 0.1% of Monomer | 0.1% of Monomer |
| 2,2-Dimethoxy-2-phenyl acetophenone | 1 | 1 | 1 | 1 | 1 | 1 | 1 | 1 | 1 | 1 | 1 | 1 |
| *Activator | TPP 1 | BDP 1 | CPP 1 | TBP 1 | TPP 1 | TPA 1 | TPS 1 | BPP 1 | TPN 1 | TEA 1 | 0 | TBP 1 |
| Pentachlorobenzene | 0 | 0 | 0 | 0 | 0.5 | 0 | 0 | 0 | 0 | 0 | 0 | 0.5 |
| Exposure Time (sec.) Dot 10% Hi-light | 50 | 58 | 65 | 120 | 50 | 150 | 135 | 155 | 165 | 180 | 160 | 120 |
| Depth 45% Middle Tone | 270 | 275 | 265 | 150 | 270 | 140 | 155 | 140 | 130 | 120 | 160 | 145 |
| 90% Shadow | 125 | 120 | 120 | 55 | 120 | 50 | 55 | 50 | 45 | 45 | 50 | 55 |
| Plate Quality (μ) | 55 | 55 | 55 | Plug Dot 140 | 55 | Plug Dot 50 | Plug Dot 50 | Plug Dot 80 | Plug Dot 130 | Plug Dot 150 | Plug Dot 140 | Plug Dot 140 |
| Width of Minimum Remaining Line (μ) | 40 | 50 | 50 | 13 | 40 | 15 | 15 | 14 | 13 | 11 | 13 | 13 |
| Gray Step | 17 | 16 | 16 | Not Acceptable | 17 | Not Acceptable | Not Acceptable | Not Acceptable | Not Acceptable | Not Acceptable | Not Acceptable | Not Acceptable |
| Overall Quality | Acceptable | Acceptable | Acceptable | Not Acceptable | Acceptable | Not Acceptable | Not Acceptable | Not Acceptable | Not Acceptable | Not Acceptable | Not Acceptable | Not Acceptable |

*TPP: Triphenylphosphine
BDP: n-Butyldiphenylphosphine
CPP: Dichlorophenylphosphine
TBP: Tri-n-butylphosphine
TPA: Triphenylarsine
TPS: Triphenylantimony
BPP: Dibutylphenylbismuthine
TPN: Triphenylamine
TEA: Triethanolamine Examples 1, 2 and 3 demonstrate that the use of phosphine derivatives having 3 (triphenyl phosphine), 2 (n-butyl-diphenyl phosphine) and 1 (dichlorophenyl phosphine) phenyl groups in the phosphine activator component of the present invention all produce printing plates with satisfactory properties. Surprisingly, however, the degree of acceptance decreases as the number of phenyl groups is decreased from 3 to 1, e.g., exposure time increases, dot depth decreases, and gray step values decrease, but all within acceptable limits.

Example 4 demonstrates that the use of a phosphine derivative with no phenyl groups (tri-n-butyl phosphine), with all other parameters remaining the same, does not result in a printing plate having satisfactory conditions for newspaper printing applications.

Likewise when derivatives of Group V elements such as nitrogen, arsenic, antimony and bismuth are used in place of phosphorous, the resultant printing plate has unsatisfactory properties (Examples 6–10). Surprisingly, this is the case even when three phyenl groups are used (tripeanylarsine, triphenylantimony and triphenylamine), or when two phenyl groups are used (dibutylphenylbismithine).

Finally, the presence of a halogenate compound such as pentachlorobenzene neither improves the properties of the resultant plate (compare Examples 1 and 5) nor renders the resultant plate satisfactory when a phosphine derivative with at least one phenyl group is not present (compare Examples 4 and 12).

It, of course, should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

We claim:

1. A photosensitive element comprising a substrate and a layer of water developable photopolymerizable composition including:
   a. about 0.1 to 3.0 parts by weight of a monomer component including at least one water-soluble, monofunctional unsaturated ethylenic monomer, or the combination of said monofunctional monomer and at least one polyfunctional unsaturated ethylenic monomer, said monomers capable of forming a polymer by photoinitiated polymerization in the presence of a polymerization initiator activatable by actinic light;
   b. about 0.1 to 3.0 parts by weight of a polymer component including a partially saponified, water-soluble, polyvinyl acetate polymer compatible with said monomer component containing both acetyl and hydroxy groups, and having a polymerization degree of about 300 to 2,000 and a saponification degree of about 65 to 99 mole percent;
   c. about 0.001 to 0.3 parts by weight of a photopolymerization initiator compatible with said monomer component and said polyvinyl acetate polymer, and activatable by actinic light; and,
   d. about 0.001 to 0.3 parts by weight of an activator including a phosphine derivative described by the formula:

wherein any of X, Y and Z are hydrogen, halogen, alkyl, alkoxy, aryl, or vinyl, but not more than one of the X, Y and Z is hydrogen, and wherein at least one of X, Y and Z is aryl.

2. A photopolymerizable composition according to claim 1 wherein said activator is selected from the group consisting of triphenyl phosphine, o-tolyl diphenyl phosphine, di-(o-tolyl) phenyl phosphine, tri-(o-tolyl) phosphine, o-methoxyphenyl diphenyl phosphine, o-ethylphenyl diphenyl phosphine, and o-chlorophenyl diphenyl phosphine.

3. The photosensitive element of claim 1 wherein said substrate is a chemically or mechanically braded metallic and/or plastic plate.

4. The photosensitive element of claim 1 further having a binder composition carrying a plurality of dispersed particles interposed between said substrate and said layer of photopolymerizable composition, said dispersed particles being present in a size and concentration sufficient to create a plurality of protuberances in the background areas of said photosensitive element after exposure and development of said photopolymerizable composition to create a relief image.

5. The photosensitive element of claim 4 wherein said dispersed particles are selected from the group consisting of (a) glass beads, (b) polytetrafluorethylene and (c) alumina powder and said binder layer is selected from the group consisting of styrene-butadiene copolymers, polyesters, glyoxal, and mixtures of (a), (b) or (c) and partially hydrolyzed polyvinyl acetate.

6. The photosensitive element of claim 4 wherein said photopolymerized layer has a thickness between about 0.004 and 0.035 inch.

* * * * *